US006803782B2

(12) United States Patent
Koob et al.

(10) Patent No.: US 6,803,782 B2
(45) Date of Patent: Oct. 12, 2004

(54) ARRAYED PROCESSING ELEMENT REDUNDANCY ARCHITECTURE

(76) Inventors: John Conrad Koob, 11135-83 Avenue #910, Edmonton, AB (CA), T6G 2C6; Raymond Jit-Hung Sung, 7212 Avalon Dr., Wilmington, MA (US) 01887; Tyler Lee Brandon, 205 Kingfisher Bay, Sherwood Park, AB (CA), T8A 3M1; Duncan George Elliot, 364 Burton Road, Edmonton, AB (CA), T6R 2J5

( * ) Notice: Subject to any disclaimer, the term of this patent is extended or adjusted under 35 U.S.C. 154(b) by 0 days.

(21) Appl. No.: 10/395,656

(22) Filed: Mar. 21, 2003

(65) Prior Publication Data

US 2003/0179631 A1 Sep. 25, 2003

Related U.S. Application Data

(60) Provisional application No. 60/365,804, filed on Mar. 21, 2002.

(51) Int. Cl.[7] .............................................. H03K 19/177
(52) U.S. Cl. ............................... 326/10; 326/9; 326/38; 365/200; 716/17; 716/12
(58) Field of Search .......................... 326/9, 10, 38–41; 365/200, 223, 225.7, 230.03, 189.01, 230.01; 716/17, 12

(56) References Cited

U.S. PATENT DOCUMENTS

| | | | |
|---|---|---|---|
| 5,274,593 A | * | 12/1993 | Proebsting .................. 365/200 |
| 5,321,510 A | | 6/1994 | Childers et al. |
| 5,450,603 A | | 9/1995 | Davies |
| 5,498,975 A | | 3/1996 | Cliff et al. |
| 5,546,343 A | | 8/1996 | Elliott et al. |
| 5,956,274 A | | 9/1999 | Elliott et al. |
| 5,970,013 A | | 10/1999 | Fischer et al. |
| 6,166,559 A | * | 12/2000 | McClintock et al. ......... 326/10 |
| 6,279,088 B1 | | 8/2001 | Elliott et al. |
| 6,330,199 B2 | | 12/2001 | Jung et al. |
| 6,337,578 B2 | * | 1/2002 | Jefferson et al. .............. 326/38 |
| 6,337,816 B1 | | 1/2002 | Park et al. |
| 2001/0053105 A1 | | 12/2001 | Elliott et al. |

OTHER PUBLICATIONS

Miwa, et al., "A 1–Mb 2–Tr/b Nonvolatile CAM Based on Flash Memory Technologies," IEEE *J. of Solid–State Circuits*, 31(11): 1601–1609 (1996).

Yamashita, H., et al. "A 28×128 CMOS Imager with 4×128 Bit–Serial column–Parallel PE Array," *ISSCC/Session 6/ CMOS Image Sensors with Embedded Processors/ 6.6, IEEE Solid–State Circuits Conference*, (2001).

Gealow, et al., "A Pixel–Parallel Image Processor Using Logic Pitch–Matched to Dynamic Memory," IEEE *J. of Solid–State Circuits*, 34(6):831–839 (1999).

Childers, et al., "SVP: Serial Video Processor," IEEE *Custom Integrated Circuits Conference* (1990).

Yano, K. et al., "A 3–8–ns CMOS 16 × 16–b Multiplier Using Complementary Pass–Transistor Logic," IEEE *J. of Solid State circuits*, 25(2): 388–395 (1990).

Elliott, et al., "Computational RAM: Implementing Processors in Memory," IEEE *Design & Test of Computers*, 32–41 (1999).

* cited by examiner

*Primary Examiner*—Vibol Tan
(74) *Attorney, Agent, or Firm*—Hamilton, Brook, Smith & Reynolds, P.C.

(57) ABSTRACT

A column redundancy architecture for arrayed parallel processor devices is disclosed. In particular, daisy chained communication between processing elements is preserved after defective memory columns and their associated processing elements are disabled, by setting a bypass circuit within the processing element to be disabled. An address remapping circuit ensures that spare memory columns and associated processing elements replacing the defective memory columns and processing elements can be addressed in a linear column order. The column redundancy architecture is flexible as it permits replacement of arbitrary numbers of series adjacent processing elements as well as non adjacent processing elements with a minimal impact on device performance.

23 Claims, 8 Drawing Sheets

ARRAYED PROCESSING ELEMENT REDUNDANCY ARCHITECTURE

This application claims priority from U.S. application Ser. No. 60/365,804 filed Mar. 21, 2002.

FIELD OF THE INVENTION

The present invention relates to semiconductor memory. In particular, the present invention relates to column redundancy architectures of computational random access memories.

BACKGROUND OF THE INVENTION

Redundancy circuits are essential to boosting production yield of semiconductor devices, especially high density memory devices, since defects are more likely to occur in the high density memory arrays than in the peripheral circuits. Various redundancy schemes have been developed to repair memories having faulty memory cells during testing. Such fault tolerant schemes can involve column redundancy for replacing the column having the defect, with a redundant column of the memory array.

Many redundancy schemes have been proposed in the art for increasing semiconductor yield, which are generally implemented as follows. Once the location of a defective memory cell or cells is identified during testing, the column it is part of is effectively removed from the memory array by ensuring that it can no longer be addressed. A spare column of memory cells physically located elsewhere on the chip is programmed to be accessed by the logical address that would have accessed the defective column. Address programming is typically done through the use of laser-blown fuses and anti-fuses, for example.

Another type of integrated circuit device that requires column redundancy to increase yield are computational random access memories (CRAM). CRAM is a memory device having arrayed parallel processors with hundreds to thousands of processors coupled to a memory array. CRAM is a processor in memory architecture that takes advantage of the large internal memory bandwidth available at the sense amplifiers. By pitch matching each bit serial processing element (PE) to one or more memory columns, CRAM can operate as a massively parallel single instruction stream, multiple data stream (SIMD) computer. CRAM architectures and arrayed parallel processor architectures are well known in the art.

An example of a prior art CRAM is shown in FIG. 1. The CRAM 20 shown in FIG. 1 includes two banks 22 and 24, labeled "Bank 1" and "Bank 2" respectively, although a CRAM can contain any number of banks. Bank 22 includes a memory array 26 coupled to peripheral circuits such as row decoders 28, processing elements (PE's) 30, and column decoders 32. Bank 24 is identically configured to bank 22, and includes a memory array 34 coupled to peripheral circuits such as row decoders 36, PE's 38, and column decoders 40. Memory arrays 26 and 34 can be of any type of memory, such as dynamic random access memory (DRAM) or static random access memory (SRAM), for example, with row decoders 28 and column decoders 32 selecting particular memory cells for read and write operations. Each PE 30 has direct access to a single column of memory for use as its local memory, and is coupled to a common broadcast bus 42. As shown in FIG. 1, PE's 30 and 38 are all coupled to the same broadcast bus 42, which can further extend to other banks of the chip. The PE's 30 are connected to the common broadcast bus 42 in a wired AND configuration, allowing the common broadcast bus 42 to function as a dynamic zero detect circuit. Furthermore, if at least one PE 30 writes a zero to the common broadcast bus 42, all other PE's 30 receive the zero value for register write back.

An example of a prior art PE 30 or 38 used in CRAM 20 of FIG. 1 is shown in FIG. 2. A pair of adjacent PE's 30 are shown in FIG. 2, illustrating the interconnections between each other and the broadcast bus 42. The presently shown PE's 30 support bit-serial computation, left-right nearest-neighbor communication, wired-AND broadcast bus evaluation and external databus access. PE 30 includes a single-bit memory register 50, a single-bit write enable register 52, a single-bit shift left register 54 and a single-bit shift right register 56, an arithmetic logic unit (ALU) 58, and a transceiver 60. Memory register 50 can include well known bitline sense amplifiers, for example. In addition to providing shifting functionality, registers 54 and 56 can be used as temporary storage locations for the results provided by the ALU 58. Each of the four single-bit registers is implemented as a six transistor dual rail RAM cell in the present embodiments, but can be implemented with any equivalent register circuit. The registers can include additional gating circuits that receive control signals for controlling the input and output of data, which are not shown in FIG. 4 to simplify the schematic, but understood to be required for proper operation by those of skill in the art. For example, shift left register 54 can receive a right shift control signal for storing data from the PE to the right. In this particular example, the registers store data as complementary logic levels, and complementary signal lines carry the data between the PE components. It should be obvious to those of skill in the art that single-ended logic levels and signal lines can be used in alternate embodiments.

Memory register 50 stores data received from, or to be written to, a memory cell of its associated memory column, and write enable register 52 includes combinational logic to determine whether a PE 30 should write its result to its local memory via memory register 50. Shift left register 54 receives result data from the PE 30 to its right, while shift right register 56 receives result data from the PE 30 to its left. ALU 58 receives an 8-bit opcode, a single bit of data from memory register 50, shift left register 54 and shift right register 56, and provides a result from its output. ALU 58 consists of a multiplexer that can implement any boolean function of the three single bit inputs it receives. The result output of ALU 58 is provided to each register of PE 30, and to transceiver 60 for communicating data between the PE 30 and the broadcast bus 42. The bus transceiver 60 is implemented with static CMOS NOR gates that connect to NMOS pull down transistors. The memory can also be accessed externally through a conventional databus 62.

Because memory array 26 of FIG. 1 is no different than the memory array of commodity semiconductor memory devices, a column redundancy scheme to correct memory defects is necessary to maximize manufacturing yield. Unfortunately for CRAM devices, replacing the defective column of memory cells with a spare column of memory cells inherently requires replacement the PE 30 coupled to the defective column. This is significant because the communication lines between adjacent PE's must remain uninterrupted for proper operation. As can be seen in FIG. 2, the PE's adjacent to the PE to be removed (disabled) will need to communicate with each other in order to maintain proper operation of the CRAM.

It should be noted that manufacturing defects can occur in the PE 30 itself, eventhough its associated memory column has no defective cells. Correspondingly, a defective PE 30 requires replacement of the PE 30 and its associated memory column.

Several column redundancy schemes that can be applied to CRAM are known in the art. For example, address remapping circuits can be used to preserve the sequential address space of the memory columns, with defective columns being "bypassed" when addressed. These remapping circuits tend to have high latency that negatively impact the performance of the CRAM.

Another column redundancy scheme has nearest-neighbor interconnect that can be utilized for PE fault tolerance, but is not useful for situations in which arbitrary numbers of series-adjacent PE's are defective.

Redundancy can be provided with bypass switches that are used as conductors which are shorted or blown by a laser. Unfortunately, these bypass switches consume large circuit area and cannot be incorporated into the pitch limited PE area.

It is, therefore, desirable to provide a CRAM column redundancy scheme in which non-adjacent PE's can communicate with each other after any number of PE's have been effectively removed from the memory array. It is further desirable to provide a CRAM column redundancy scheme with high speed address remapping, and PE redundancy circuits that fit within the pitch limited PE area.

SUMMARY OF THE INVENTION

It is an object of the present invention to obviate or mitigate at least one disadvantage of previous bi-directional bus line amplifier circuits and methods. In particular, it is an object of the invention to provide a high-speed bi-directional bus line architecture.

In a first aspect, the present invention provides a redundancy enabled processing element. The redundancy enabled processing element including a logic circuit and a bypass circuit. The logic circuit receives data from adjacent processing elements and generates result data corresponding to the function of the logic circuit. The bypass circuit receives the data from the adjacent processing elements and the result data. The bypass circuit is settable for passing the result data to one of the adjacent processing elements in a normal mode of operation and settable for passing the data from the one of the adjacent processing elements to the other of the adjacent processing elements in a bypass mode of operation.

In an embodiment of the present aspect, the bypass circuit includes a skip register for providing a skip register output for setting the bypass circuit to the bypass mode of operation. The skip register can include a pair of cross-coupled inverters, where the output of one of the cross-coupled inverters provides the skip register output, and a pair of access transistors for coupling the cross-coupled inverters to complementary skip data.

In other aspects of the present embodiment, the redundancy enabled processing element further includes a memory register for providing the complementary skip data to the skip register, and a transceiver circuit for transferring the result data between a broadcast bus and the logic circuit, where the transceiver circuit is disabled in response to the skip register output.

In yet another aspect of the present embodiment, the bypass circuit includes a first multiplexer for receiving the data from one of the adjacent processing elements and the result data, and a second multiplexer for receiving the data from the other of the adjacent processing elements and the result data. The first and second multiplexers pass one of the data and the result data in response to the skip register output.

In a second aspect, the present invention provides a method of disabling a redundancy enabled processing element. The method includes the steps of loading a skip register of a bypass circuit with skip data, disabling a transceiver circuit in response to the skip data stored in the skip register, and coupling data communication lines of a first adjacent processing element to a second adjacent processing element in response to the skip data stored in the skip register.

In an embodiment of the present aspect, the step of loading includes driving a databus with the skip data, loading a memory register with the skip data from the databus, and activating access transistors of the skip register for storing the skip data provided by the memory register.

In other alternate embodiments of the present aspect, the step of coupling includes switching first and second multiplexers to a bypass state and activating a spare processing element to replace the disabled redundancy enabled processing element. According to an aspect of the present alternate embodiment, the step of activating includes storing an address location of the disabled redundancy enabled processing element, and remapping a logical address for generating a physical address offset by the stored address location.

In another aspect of the present alternate embodiment, the step of remapping can include comparing the logical address with the stored address location, generating an offset value if the logical address is greater than the stored address location, and adding the offset value to the logical address for generating the physical address.

In an alternate embodiment of the present aspect, the step of remapping can include comparing the logical address with the stored address location and generating a selection signal corresponding thereto, generating pre-computed physical addresses in parallel with the step of comparing, and selecting one of the pre-computed physical address as the physical address in response to the selection signal.

In a third aspect, the present invention provides a computational random access memory having a plurality of memory columns. The computational random access memory includes row decoders, processing elements and spare processing elements. The row decoders access memory cells in each memory column. The processing elements are coupled to the memory columns, where each processing element includes a logic circuit for receiving data from adjacent processing elements and for generating result data corresponding to the function of the logic circuit, and a bypass circuit for receiving the data from the adjacent processing elements and the result data. The bypass circuit is settable for passing the result data to one of the adjacent processing elements in a normal mode of operation and settable for passing the data from the one of the adjacent processing elements to the other of the adjacent processing elements in a bypass mode of operation. The spare memory columns and associated spare processing elements located in the memory for replacing faulty memory columns and associated disabled processing elements.

In embodiments of the present aspect, each processing element is coupled to a single memory column or to more than one memory column.

In another embodiment of the present aspect, the bypass circuit includes a skip register for providing a skip register output for setting the bypass circuit to the bypass mode of operation. The skip register can include a pair of cross-coupled inverters, where the output of one of the cross-coupled inverters providing the skip register output, and a pair of access transistors for coupling the cross-coupled inverters to complementary skip data. The bypass circuit can further include a first multiplexer for receiving the data from one of the adjacent processing elements and the result data, and a second multiplexer for receiving the data from the other of the adjacent processing elements and the result data, such that the first and second multiplexers pass one of the data and the result data in response to the skip register output.

In yet another embodiment of the present aspect, the processing element further includes a memory register for providing the complementary skip data to the skip register, and a transceiver circuit for transferring the result data between a broadcast bus and the logic circuit. The transceiver circuit can be disabled in response to the skip register output.

In another embodiment of the present aspect, the computational random access memory further includes an address remapping circuit for generating a physical address offset by addresses of the faulty memory columns and associated disabled processing elements. The address remapping circuit can include a comparator, a priority encoder and an adder. The comparator compares a logical address to a faulty address location corresponding to the disabled processing element. The priority encoder generates an offset value if the logical address is greater than the faulty address location. The adder generates the physical address corresponding to the sum of the logical address and the offset value.

BRIEF DESCRIPTION OF THE DRAWINGS

Embodiments of the present invention will now be described, by way of example only, with reference to the attached Figures, wherein.

DETAILED DESCRIPTION OF THE INVENTION

A column redundancy architecture for arrayed parallel processor devices is disclosed. In particular, daisy chained communication between processing elements is preserved after defective memory columns and their associated processing elements are disabled, by setting a bypass circuit within the processing element to be disabled. An address remapping circuit ensures that spare memory columns and associated processing elements replacing the defective memory columns and processing elements can be addressed in a linear column order. The column redundancy architecture is flexible as it permits replacement of arbitrary numbers of series adjacent processing elements as well as non adjacent processing elements with a minimal impact on device performance.

The column redundancy architecture embodiment of the present invention adds minimum circuitry to the PE to circumvent pitch matching issues, while maintaining communications between the PE's.

Figure 1:
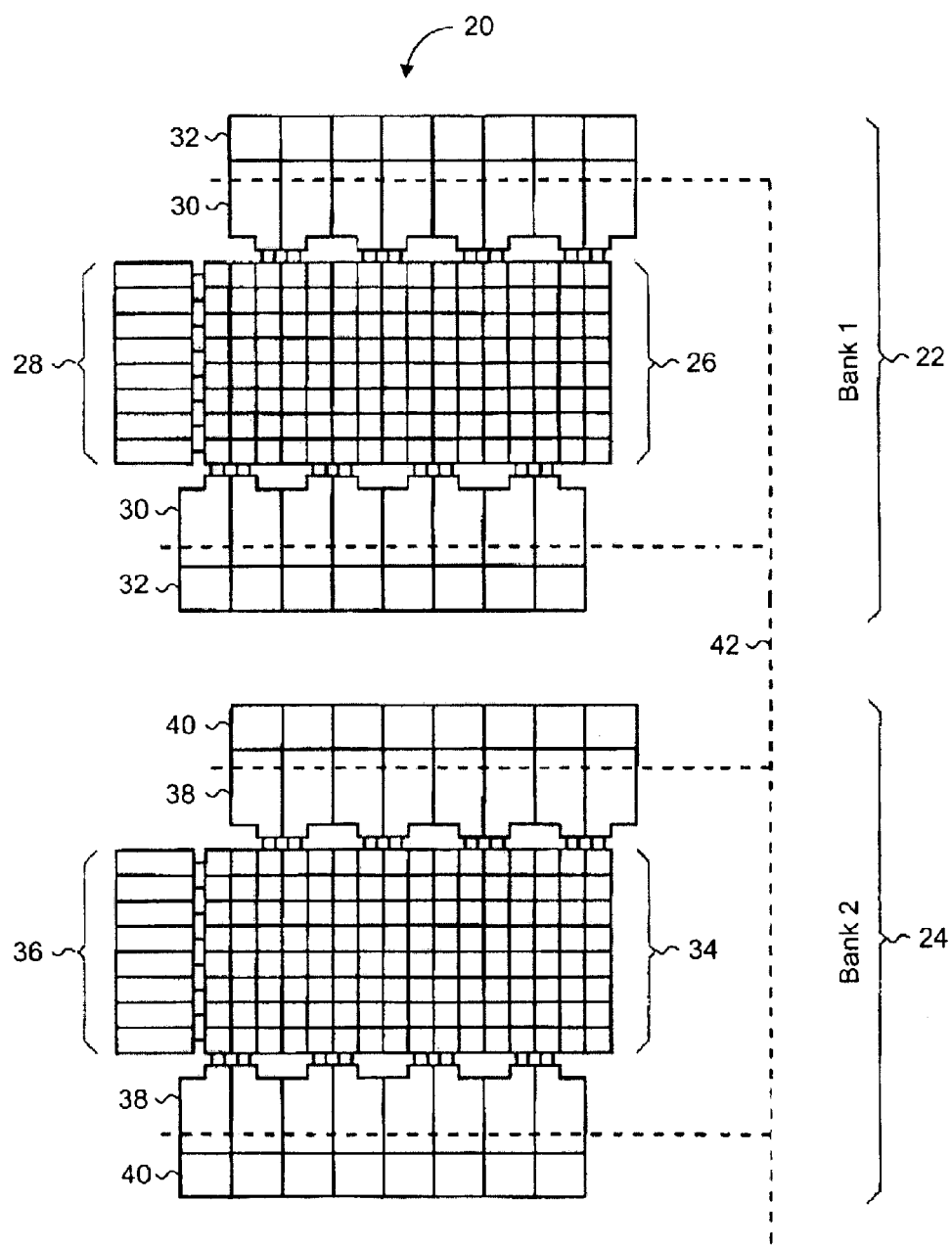
FIG. 1 is a block diagram showing a prior art CRAM architecture.
Figure 3:
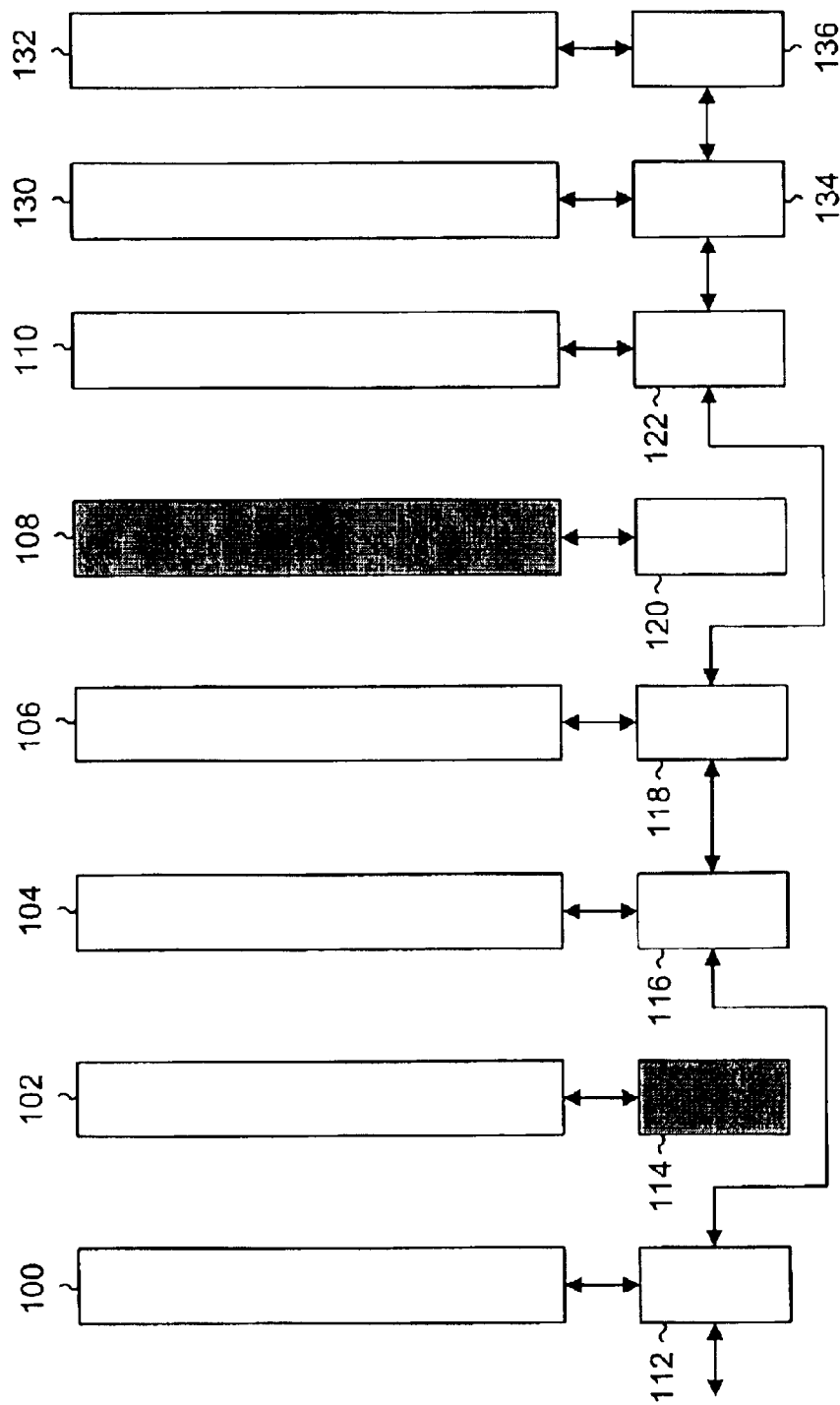
FIG. 3 is a block diagram illustrating a CRAM column redundancy scheme according to an embodiment of the present invention.

FIG. 3 schematically illustrates how defective PE's and memory columns can be bypassed while preserving linear column order for memory addressing, according to an embodiment of the column redundancy architecture of the present invention. The memory array includes memory columns 100, 102, 104, 106, 108 and 110, and their corresponding PE's 112, 114, 116, 118, 120 and 122. Located at the end of the memory array are spare memory columns 130 and 132, each with their respective PE's 134 and 136. While the spare columns and their respective PE's are shown at the end of the memory array, they can be located at any position within the memory array in alternate embodiments. Each memory column includes memory cells that can be the same as a memory column in memory array 34 of FIG. 1. PE's 112, 114, 116, 118, 120 and 122 are redundancy enabled, and each includes a bypass circuit to selectively disable it. Arrows indicate the direction of data flow between PE's and a PE and its corresponding memory column. The present example illustrates a single PE coupled to a single memory column, but alternate memory arrays can have a group of two or more memory columns multiplexed to each PE. Accordingly, appropriate column decoding techniques known to those of skill in the art is used to select a particular memory column of the group to access the PE.

In FIG. 3, memory column 108 is found to have one or more defective, or faulty memory cells, and PE 114 is found to be defective during a chip testing operation. Testing systems and methods for detection and identification of faulty memory cells and PE's should be known to those of skill in the art. Therefore, PE 120 associated with memory column 108, and memory column 102 associated with PE 114 should be disabled. According to an embodiment of the present invention, a skip register of the bypass circuit in PE's 114 and 120 is set to a bypass state to remove PE's 114 and 120 from the communication chain, and connect PE's 112 and 116, and PE's 118 and 122 to each other. Thus PE's 114 and 120 are disabled. In the present example, one or both defective memory columns 102, 108 and their respective PE's 114, 120 can be replaced by spare columns 130, 132 and their respective PE's 134, 136. Because spare PE's 134 and 136 are also redundancy enabled, their skip registers can be set to the bypass state by default to ensure that they are disconnected from the other PE's of the memory array. Hence, the spare PE's can be activated to replace faulty, or disabled PE's by setting their skip registers to the normal state, resulting in coupling of communication lines between the normal PE's and the activated spare PE's. An address remapping circuit preserves the linear column order for memory addressing after PE's 114 and 120 are disabled.

As shown in FIG. 3, PE's 112 and 116 bypass PE 114 in order to communicate directly with each other, while PE's 118 and 122 bypass PE 120 in order to communicate directly with each other. While two non-series adjacent PE's are shown as disabled in FIG. 3, any number of series adjacent PE's can be disabled. Furthermore, any two non-adjacent normal PE's physically separated by series adjacent disabled PE's will be in communication with each other.

Figure 2:
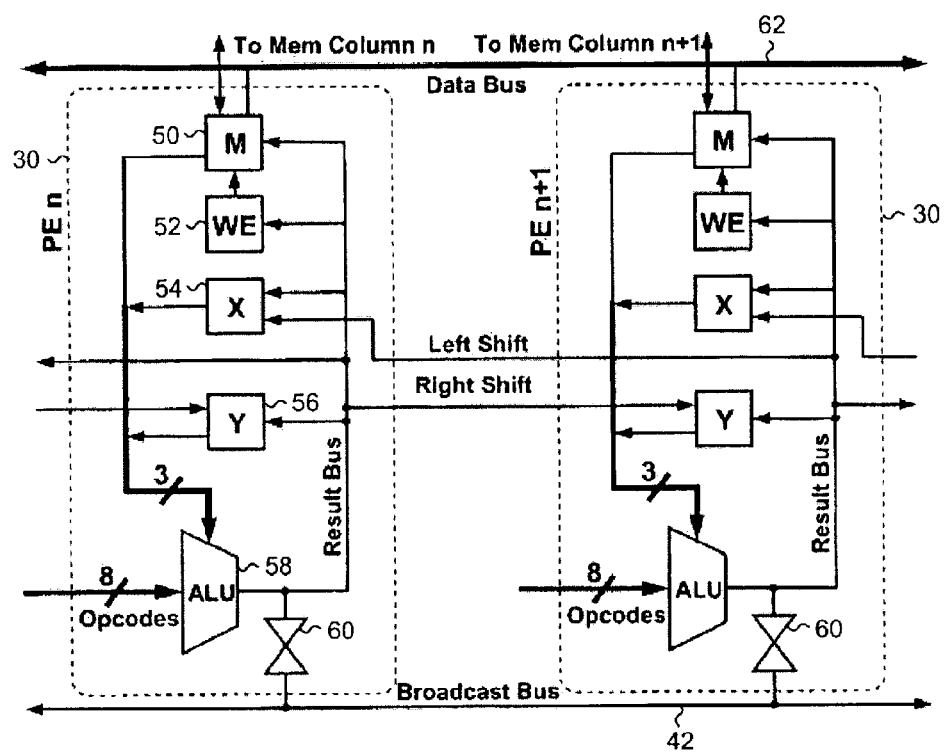
FIG. 2 is a block diagram showing details of the processing elements shown in FIG. 1.
Figure 4:
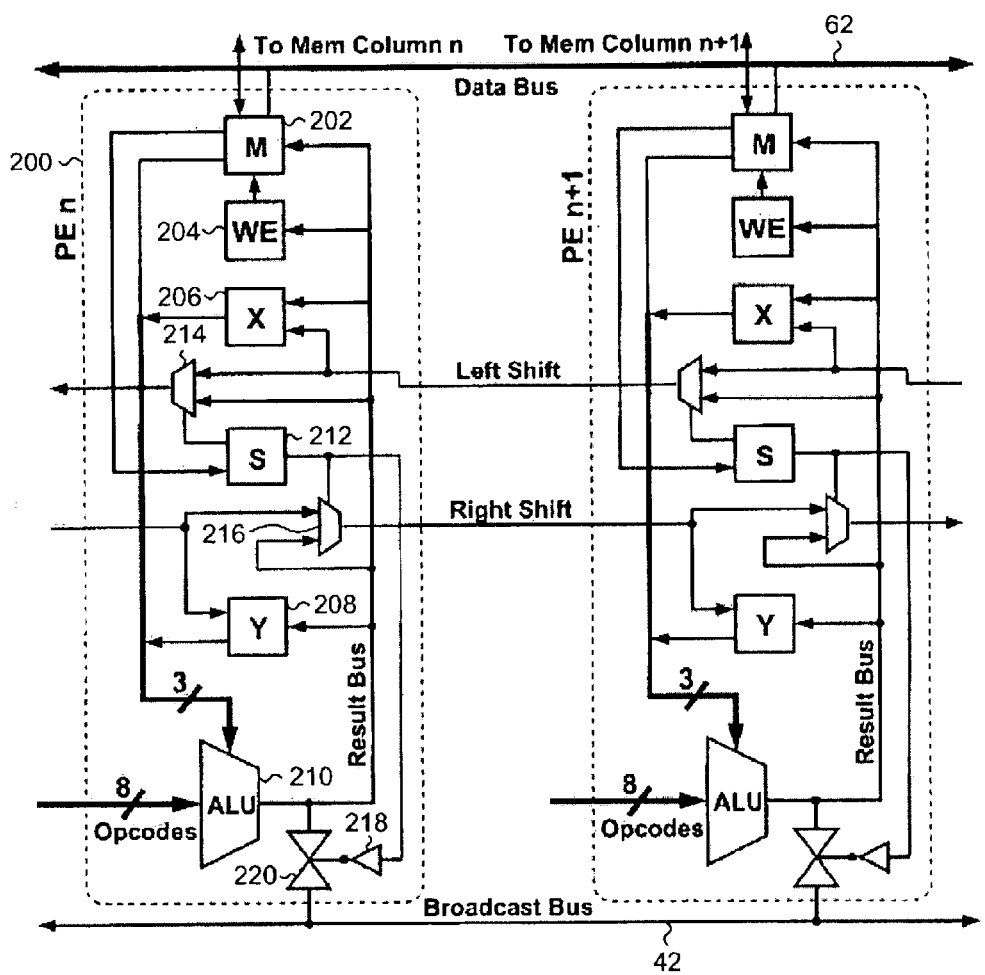
FIG. 4 is a block diagram showing details of bypass enabled processing elements according to an embodiment of the present invention.

A circuit schematic of a redundancy enabled PE according to an embodiment of the present invention is shown in FIG. 4. PE 200 includes the same components as PE 30 of FIG. 2, but includes a bypass circuit for selectively disabling the PE. Memory register 202, write enable register 204, shift left register 206, shift right register 208, ALU 210 and transceiver 220 can be the same as memory register 50, write enable register 52, shift left register 54, shift right register 56, ALU 58 and transceiver 60 respectively. Memory register 202 however, includes an additional signal line coupled to the bypass circuit. The bypass circuit includes a skip register 212, a left shift multiplexer 214, a right shift multiplexer 216 and inverter 218. Inverter 218 is used to invert the logic level of a control signal provided by skip register 212, however, inverter 218 is not required if the control signal provided by skip register 212 is already provided with the appropriate logic level. Skip register 212 is coupled to receive data from memory register 202 through the additional signal line, and provides a disable signal to multiplexers 214, 216 and to transceiver 220 via inverter 218. Multiplexer 214 is a 2-1 multiplexer having a first input for receiving data from the PE to the right, and a second input for receiving data from ALU 210. Multiplexer 216 is a 2-1 multiplexer having a first input for receiving data from the PE to the left, and a second input for receiving data from ALU 210. Multiplexers 214 and 216 operate in a bypass mode to pass data from another PE and a normal mode to pass its own data, in response to the logic level of the disable signal provided by skip register 212.

The skip register 212 determines whether or not the PE is deactivated and should be skipped over during left-right nearest neighbor communications. The multiplexers 214 and 216 control the source of the data, which can originate from the current PE via the output of ALU 210, or from a neighboring PE via its own bypass circuit.

Circuit details of the bypass circuit are now described.

Figure 5:
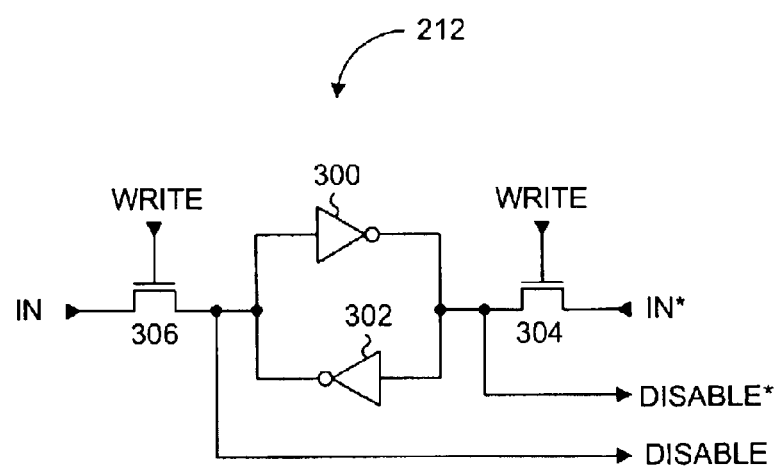
FIG. 5 is a circuit schematic of the status register shown in FIG. 4.

FIG. 5 is a circuit schematic of skip register 212 shown in FIG. 4. Skip register 212 is implemented as a six transistor CMOS memory cell having a pair of cross-coupled inverters 300 and 302 with their outputs connected to respective n-channel access transistors 304 and 306. Access transistors 304 and 306 are turned on by write access control signal WRITE, that enable complementary skip register data IN and IN* to be latched by cross-coupled inverters 300 and 302. Inputs IN and IN* are connected to memory register 202 in the present example, for receiving data from databus 62. Either one of, or both output signals DISABLE and DISABLE* can be used to control multiplexers 214, 216 and transceiver 218 of FIG. 4.

Figure 6:
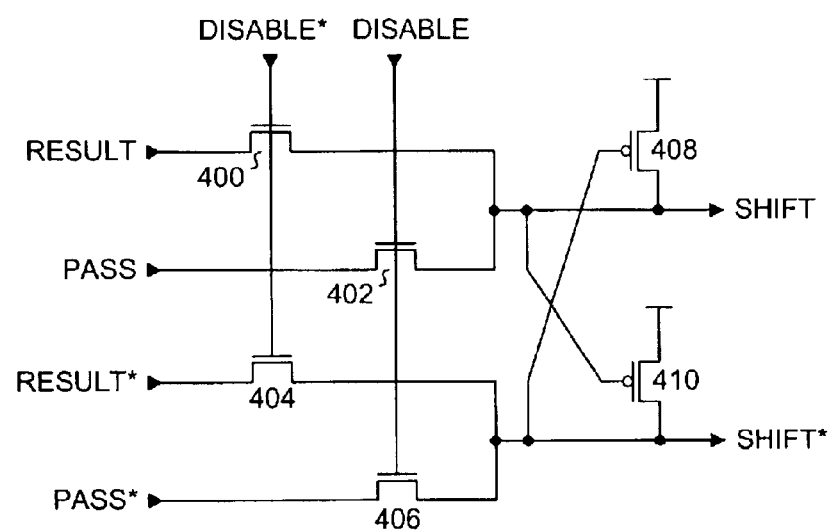
FIG. 6 is a circuit schematic of the multiplexor shown in FIG. 4.

FIG. 6 is a circuit schematic of multiplexer 214 or 216 shown in FIG. 4. Multiplexer 214 is implemented in complementary pass transistor logic (CPL) for minimizing the transistor count and resulting layout area overhead of the PE. Preferably, the redundancy enabled PE 200 of FIG. 4 is pitch matched to its respective memory column. Multiplexer 214/216 includes n-channel pass transistors 400, 402, 404, 406, and dynamic p-channel pull-up transistors 408 and 410. Pass transistors 400, 402, 404 and 406 are arranged in a well-known complementary signal multiplexing configuration, for passing one of input pairs RESULT/ RESULT* and PASS/PASS* to the outputs SHIFT/SHIFT*. In the present example, input pair RESULT/RESULT* is connected to the output of ALU 210, and input pair PASS/ PASS* is connected to a shifted output from an adjacent PE. More specifically, multiplexer 214 receives the left shift data output from the PE to its right and provides its SHIFT/ SHIFT* output to the PE to its left, and multiplexer 216 receives the right shift data output from the PE to its left and provides its SHIFT/SHIFT* output to the PE to its right. Pull-up transistor 408 couples VDD to SHIFT when SHIFT* falls to the low logic level, and pull-up transistor 410 couples VDD to SHIFT* when SHIFT falls to the low logic level. Pull-up transistors 408 and 410 speed up low logic level to high logic level voltage transitions to improve performance.

Signals DISABLE and DISABLE* provided by skip register 212 of FIG. 4 select the input pair to be output on SHIFT and SHIFT*. In this particular embodiment, the PE is disabled when skip register 212 is set to drive DISABLE to the active high logic level and DISABLE* to the active low logic level. Thus, when DISABLE is at the high logic level, pass transistors 402 and 406 are turned on for coupling the logic levels of PASS/PASS* to SHIFT/SHIFT*. Moreover, DISABLE* at the low logic level keeps pass transistors 400 and 404 turned off to block the output data of ALU 210 from being shifted to its neighboring PE's. Alternatively, when DISABLE is at the low logic level, the left or right shift data output from the neighboring PE's is blocked from the SHIFT/SHIFT* output and the logic levels of RESULT/RESULT* are coupled to SHIFT/SHIFT*. Therefore, any PE and any number of series adjacent PE's can be bypassed by setting their skip registers 212 to the appropriate logic level.

A description of the operation of PE 200 of FIG. 4 now follows.

Assuming that the device is free from defective memory columns or PE's, during shifting operations, data from either the shift left register 206 or the shift right register 208 of PE 200 can be placed on the result bus through the output of ALU 210. A right shift control signal can be asserted in the PE to the right for storing the data in its shift right register. Correspondingly, a left shift control signal can be asserted in the PE to the left for storing the data in its shift left register. In a SIMD machine, all PE's 200 will simultaneously receive the shift left or shift right control signals to perform either a left shift or right shift operation in parallel.

If a memory column or PE is found to be defective during device testing, then the physical locations of the defective memory columns and PE's are identified and stored on-chip or off-chip. During power up of the device, the PE's to be disabled will have their skip registers 212 set for bypass operation. This is achieved by driving the data bus 62 to a predetermined logic level and activating selected memory registers 202 for storing the predetermined logic level. Preferably, the defective PE' 200 are individually addressable. The WRITE control signal of PE's 200 to be disabled are activated to allow those skip registers 212 to receive the predetermined logic level stored in memory registers 202. Once set to the bypass state, skip registers 212 set multiplexers 214 and 216 to the bypass mode. Alternatively, the skip register 212 data can be shifted across the PE's 200 and then loaded into the skip register 212 via memory register 202.

Therefore during shifting operations, the multiplexers 214 and 216 of a defective PE forward the data from its neighboring PE to the next PE. If a series of PE's are disabled, then each of the disabled PE's forwards the data received from its neighboring PE until two functional PE's are connected. Therefore, devices having non-adjacent, series adjacent, and combinations of non-adjacent and series adjacent defective PE's can maintain proper connectivity of the left-right communications network. Furthermore, a skip register 212 set to the bypass state will disable its transceiver 220 and disconnect it from the global broadcast bus 42. Now the PE and its associated memory column are effectively removed from the memory array.

After faulty memory columns and their associated PE's have been disabled, or effectively removed from the memory array of the device, spare memory columns and PE's can be used to replace them. However such spare memory columns and associated PE's are preferably linearly addressed in column order to preserve the nearest neighbor communication network. An address remapping circuit is typically used to preserve linear column addressing after defective memory columns/PE's are disabled and replaced by spare memory columns/PE's. The address remapping can be accomplished by the host controller that issues the SIMD instructions or by circuits that use adders and comparators to map logical to physical addresses. A common issue with known address remapping circuits is the latency of the circuit, or the time required for generating a remapped physical address after a logical address and faulty memory column/PE addresses are provided.

Figure 7:
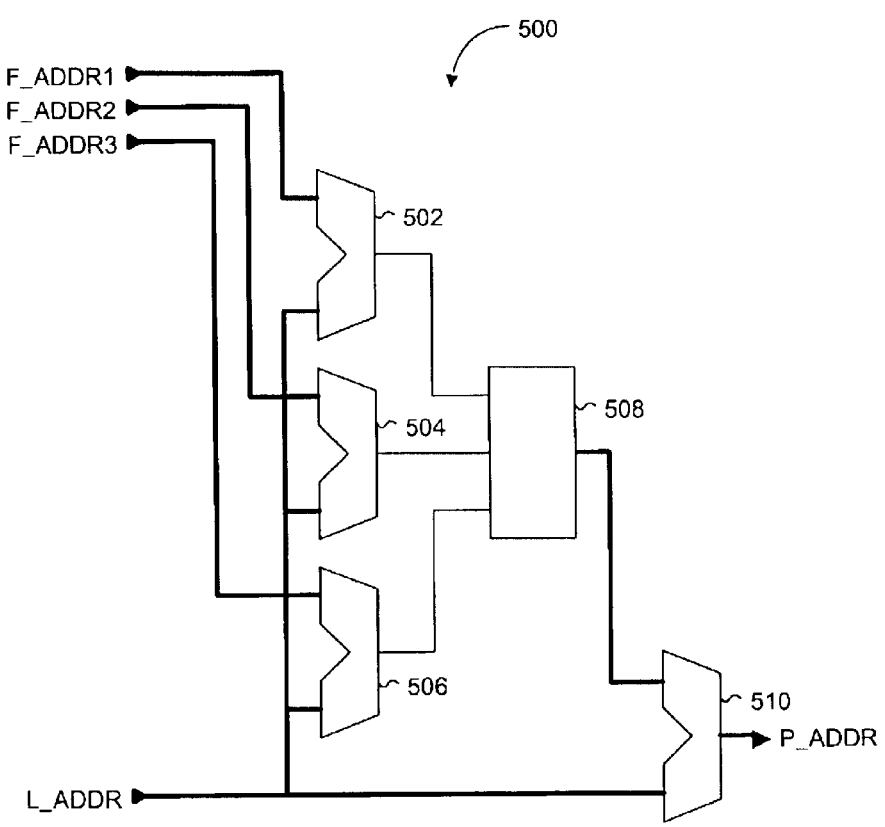
FIG. 7 is a block diagram of a logical to physical address converter circuit according to an embodiment of the present invention; and, FIG. 8 is a block diagram of an alternate logical to physical address converter circuit according to an embodiment of the present invention.

FIG. 7 shows a logical to physical address remapping circuit according to an embodiment of the present invention, having lower latency than prior address remapping circuits. Remapping circuit 500 compares a logical address generated by the host controller to the addresses of the defective and disabled memory columns/PE's, and generates a physical column address, which is a monotonic increasing function of the logical address. As previously mentioned, the addresses of the defective memory columns/PE's can be stored on or off chip during device testing. Remapping circuit 500 includes comparators 502, 504, 506, priority encoder 508, and an adder 510. Comparator 502 receives a first address F_ADDR1 corresponding to the address of one defective memory column/PE, comparator 504 receives a second address F_ADDR2 corresponding to the address of a second defective memory column/PE, and comparator 506 receives a third address F_ADDR1 corresponding to the address of a third defective memory column/PE, and all three comparators receive the logical address L_ADDR in parallel. The outputs of each comparator is received by priority encoder 508, which generates an offset output. Adder 510 receives L_ADDR and the offset output generated by priority encoder 508, and generates the physical address P_ADDR.

The function of the components of remapping circuit 500 is now described.

Each comparator compares L_ADDR with its disabled memory column/PE address, and generates an active logic level comparison result if L_ADDR is greater than or equal to the disabled memory column/PE address. For example, the active logic level can be the high or low logic levels. Priority encoder 508 receives the comparison results of each comparator and generates a binary offset output corresponding to the number of active logic level comparison results. In this particular example, the offset output is represented by two bits of data. Therefore an offset of three address positions is generated if the comparison results of all three comparators is at the active logic level, indicating that the current logical address L_ADDR is greater than or equal to all three disabled memory column/PE addresses. Accordingly, an offset of zero address positions is generated when all the comparison results are at the inactive logic level, indicating that the current logical address L_ADDR is less than all three disabled memory column/PE addresses. Adder 510 receives the offset output generated by priority encoder 508 and L_ADDR, and generates a final physical address P_ADDR representing the sum of the two inputs. Thus, P_ADDR takes into account the defective memory columns/PE's, and "skips over" them to ensure that all normal and spare memory columns/PE's are addressable with the same set of logical addresses.

An example to illustrate the address remapping operation of remapping circuit 500 follows. It is assumed that the last memory column/PE of a memory array addressable with the highest logical address is defective and subsequently disabled and replaced with a spare memory column/PE typically formed adjacent to the normal memory columns/PE's. The defective address is stored as F_ADDR1, and provided to comparator 502. As F_ADDR2 and F_ADDR3 are unused, their address value is set to a value higher than the highest logical address. During normal operation, L_ADDR is compared to F_ADDR1 by comparator 502. If L_ADDR is less than F_ADDR1, then no offset is generated by priority encoder 508 and the appropriate memory column/PE is accessed. However, if L_ADDR is greater than or equal to F_ADDR1, then priority encoder 508 generates an offset of one, which is added to L_ADDR by adder 510. Now P_ADDR accesses the spare column, which is the new last memory column/PE of the memory array.

The comparators 502, 504, 506, priority encoder 508 and adder 510 are known in the art, and can be implemented with a variety of well known circuits.

Although the remapping circuit 500 of FIG. 7 is configured to receive three defective address locations, any number of comparators with corresponding defective addresses can be included in alternate embodiments. Accordingly, priority encoder 508 can be scaled to receive the additional comparison results and generate a corresponding offset output.

Figure 8:
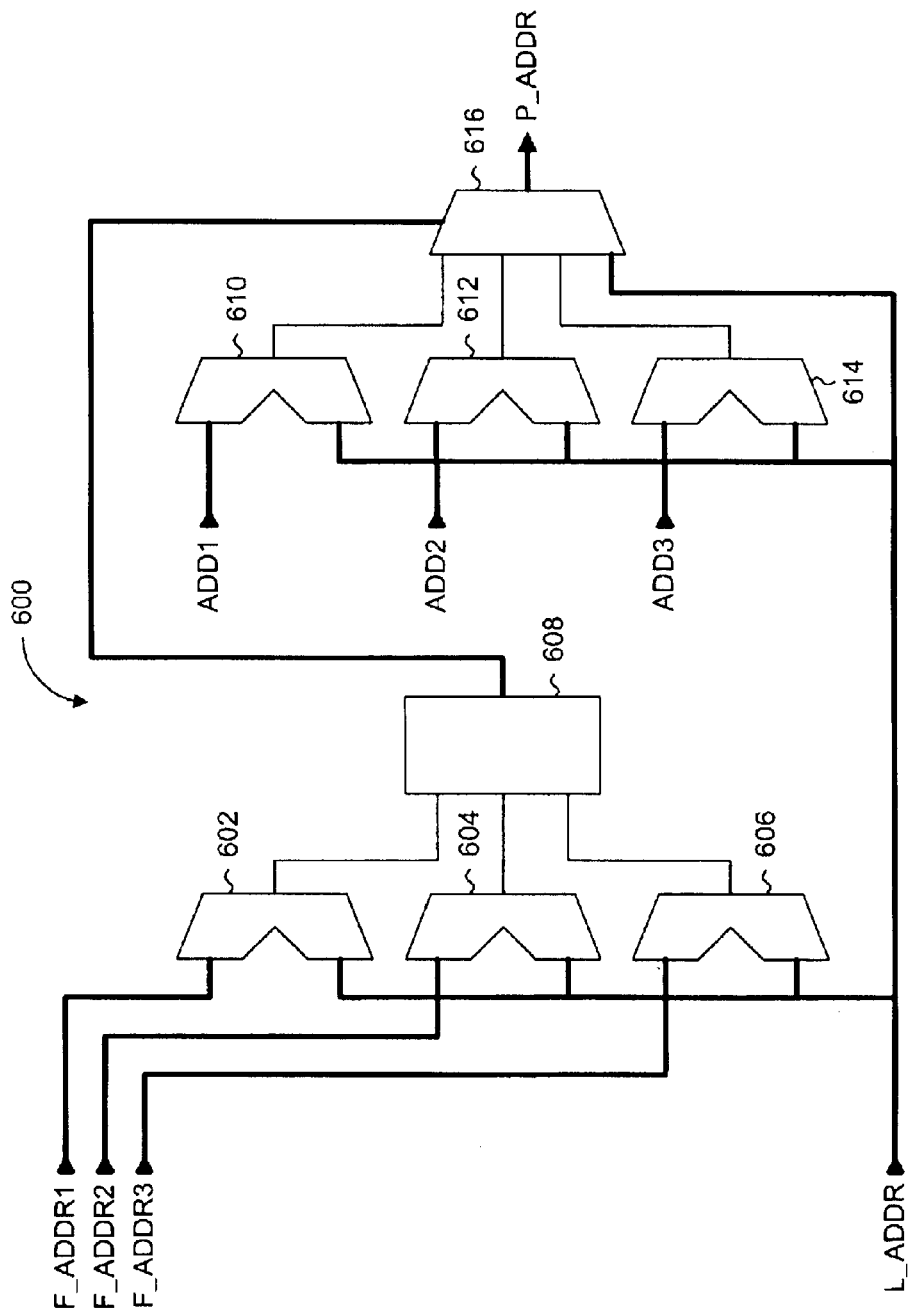

An alternate remapping circuit having a lower latency than remapping circuit 500 is shown in FIG. 8. Remapping circuit 600 is similar to the circuit of FIG. 7, but performs address comparison and offset addition in parallel to improve speed. Remapping circuit 600 includes comparators 602, 604, 606, priority encoder 608, adders 610, 612, 614, and multiplexer 616. Comparators 602, 604, 606, and priority encoder 608 can be the same as comparators 502, 504, 506 and priority encoder 508 of FIG. 7 respectively, and arranged and interconnected in the same configuration. The offset output of priority encoder 608 is coupled to the four to one multiplexer for selecting the input to pass to its P_ADDR output. Each input of priority encoder 608 receives a pre-computed physical address, except for one input which receives the logical address L_ADDR. Adder 610 receives a preset offset ADD1 having a value of one, which is added to the logical address L_ADDR. The resulting pre-computed physical address generated by adder 610 is provided to multiplexer 616. Remaining adders 612 and 614 perform the same function as adder 610, but provide a pre-computed physical address representing the sum of L_ADDR and ADD2, and L_ADDR and ADD3 respectively. ADD2 and ADD3 have offset values of two and three respectively.

When L_ADDR is asserted, comparators 602, 604, 606 and adders 610, 612, 614 perform their functions in parallel. Adders 610, 612, 614 will provide their pre-computed physical addresses to multiplexer 616 before the offset result from priority encoder 608 is generated. This is due to the inherent internal latency of priority encoder 608. The offset result from priority encoder 608 then selects the corresponding pre-computed physical address to pass on as P_ADDR. By having the possible physical addresses pre-computed at the same time the logical address is compared to the defective addresses, final physical address generation can be completed earlier than by the remapping circuit of FIG. 7.

The presently described embodiments of the column redundancy architecture for memory devices having arrayed parallel processors maintain the bi-directional communications network between PE's, after defective memory columns/PE's have been disabled. A low latency address remapping circuit preserves linear column order for addressing the memory columns after defective memory columns/PE's have been replaced with spare memory columns/PE's. Therefore, manufacturing yield can be improved while the performance of repaired devices is maximized.

While the presently described embodiments of the column redundancy architecture have been applied to a single bit, bidirectional communications network that daisy chains a row of bit serial PE's, they can be equally applied to a multi-bit, bi-directional communications network, a single bit or multi-bit unidirectional communications network, or a single bit or multi-bit multi-directional communications network with the appropriate modifications obvious to those of skill in the art. Although the bypass circuit has been applied to PE's that support bit serial computation as shown in the embodiments of the present invention, the bypass circuit can be applied to PE's that support advanced or simplified computations. In another alternate embodiment of the present invention, a PE that is pitch matched and associated with a group of memory columns can be disabled and replaced with a spare group of memory columns and associated PE.

The column redundancy architecture of the present invention can be applied to CRAM's, CMOS imagers and memory devices having arrayed parallel processing elements.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A redundancy enabled processing element comprising:
   a logic circuit for receiving data from adjacent processing elements and for generating result data corresponding to the function of the logic circuit;
   a bypass circuit for receiving the data from the adjacent processing elements and the result data, the bypass circuit settable for passing the result data to one of the adjacent processing elements in a normal mode of operation and settable for passing the data from the one of the adjacent processing elements to the other of the adjacent processing elements in a bypass mode of operation.

2. The redundancy enabled processing element of claim 1, wherein the bypass circuit includes a skip register for providing a skip register output for setting the bypass circuit to the bypass mode of operation.

3. The redundancy enabled processing element of claim 2, wherein the skip register includes
   a pair of cross-coupled inverters, the output of one of the cross-coupled inverters providing the skip register output, and
   a pair of access transistors for coupling the cross-coupled inverters to complementary skip data.

4. The redundancy enabled processing element of claim 3, further including
   a memory register for providing the complementary skip data to the skip register.

5. The redundancy enabled processing element of claim 3, further including a transceiver circuit for transferring the result data between a broadcast bus and the logic circuit, the transceiver circuit being disabled in response to the skip register output.

6. The redundancy enabled processing element of claim 2, wherein the bypass circuit includes
   a first multiplexer for receiving the data from one of the adjacent processing elements and the result data, and
   a second multiplexer for receiving the data from the other of the adjacent processing elements and the result data, the first and second multiplexers passing one of the data and the result data in response to the skip register output.

7. A method of disabling a redundancy enabled processing element comprising:
   a) loading a skip register of a bypass circuit with skip data;
   b) disabling a transceiver circuit in response to the skip data stored in the skip register; and,
   c) coupling data communication lines of a first adjacent processing element to a second adjacent processing element in response to the skip data stored in the skip register.

8. The method of claim 7, wherein the step of loading includes
   i) driving a databus with the skip data;
   ii) loading a memory register with the skip data from the databus; and,
   iii) activating access transistors of the skip register for storing the skip data provided by the memory register.

9. The method of claim 7, wherein the step of coupling includes switching first and second multiplexers to a bypass state.

10. The method of claim 7, further including activating a spare processing element to replace the disabled redundancy enabled processing element.

11. The method of claim 10, wherein the step of activating includes
    storing an address location of the disabled redundancy enabled processing element, and
    remapping a logical address for generating a physical address offset by the stored address location.

12. The method of claim 11, wherein the step of remapping includes
    comparing the logical address with the stored address location,
    generating an offset value if the logical address is greater than the stored address location, and
    adding the offset value to the logical address for generating the physical address.

13. The method of claim 11, wherein the step of remapping includes
    comparing the logical address with the stored address location and generating a selection signal corresponding thereto,
    generating pre-computed physical addresses in parallel with the step of comparing, and
    selecting one of the pre-computed physical address as the physical address, in response to the selection signal.

14. A computational random access memory having a plurality of memory columns comprising:

row decoders for accessing memory cells in each memory column;
    processing elements coupled to memory columns, each processing element including
    a logic circuit for receiving data from adjacent processing elements and for generating result data corresponding to the function of the logic circuit,
    a bypass circuit for receiving the data from the adjacent processing elements and the result data, the bypass circuit settable for passing the result data to one of the adjacent processing elements in a normal mode of operation and settable for passing the data from the one of the adjacent processing elements to the other of the adjacent processing elements in a bypass mode of operation; and,
    spare memory columns and associated spare processing elements for replacing faulty memory columns and associated disabled processing elements.

15. The computational random access memory of claim 14, wherein each processing element is coupled to a single memory column.

16. The computational random access memory of claim 14, wherein each processing element is coupled to more than one memory column.

17. The computational random access memory of claim 14, wherein the bypass circuit includes a skip register for providing a skip register output for setting the bypass circuit to the bypass mode of operation.

18. The computational random access memory of claim 15, wherein the skip register includes a pair of cross-coupled inverters, the output of one of the cross-coupled inverters providing the skip register output, and
    a pair of access transistors for coupling the cross-coupled inverters to complementary skip data.

19. The computational random access memory of claim 15, wherein the processing element further includes a memory register for providing the complementary skip data to the skip register.

20. The computational random access memory of claim 15, wherein the processing element further includes a transceiver circuit for transferring the result data between a broadcast bus and the logic circuit, the transceiver circuit being disabled in response to the skip register output.

21. The computational random access memory of claim 15, wherein the bypass circuit includes a first multiplexer for receiving the data from one of the adjacent processing elements and the result data, and a second multiplexer for receiving the data from the other of the adjacent processing elements and the result data, the first and second multiplexers passing one of the data and the result data in response to the skip register output.

22. The computational random access memory of claim 14, further including an address remapping circuit for generating a physical address offset by addresses of the faulty memory columns and associated disabled processing elements.

23. The computational random access memory of claim 22, wherein the address remapping circuit includes a comparator for comparing a logical address to a faulty address location corresponding to the disabled processing element,
    a priority encoder for generating an offset value if the logical address is greater than the faulty address location, and
    an adder for generating the physical address corresponding to the sum of the logical address and the offset value.

* * * * *